(12) United States Patent
Li et al.

(10) Patent No.: US 7,421,053 B1
(45) Date of Patent: Sep. 2, 2008

(54) FAST CLOCK ACQUISITION ENABLE METHOD USING PHASE STIR INJECTION TO PLL FOR BURST MODE OPTICAL RECEIVERS

(75) Inventors: Bing Li, Dallas, TX (US); David Wolf, Allen, TX (US); James Plesa, Addison, TX (US); Lakshman S. Tamil, Plano, TX (US)

(73) Assignee: YT Networks Capital, LLC, Wilmington, DE (US)

( * ) Notice: Subject to any disclaimer, the term of this patent is extended or adjusted under 35 U.S.C. 154(b) by 671 days.

(21) Appl. No.: 10/423,819

(22) Filed: Apr. 25, 2003

Related U.S. Application Data

(60) Provisional application No. 60/375,663, filed on Apr. 26, 2002.

(51) Int. Cl.
*H03D 3/24* (2006.01)
(52) U.S. Cl. .................. 375/376; 375/316; 375/215; 370/503; 327/331; 327/147; 327/156; 329/325; 342/103; 455/165.1; 455/260
(58) Field of Classification Search .............. 327/331, 327/147, 156; 375/376
See application file for complete search history.

(56) References Cited

U.S. PATENT DOCUMENTS

| | | | |
|---|---|---|---|
| 3,649,123 A * | 3/1972 | Ulicki .................. 356/5.11 |
| 4,359,692 A * | 11/1982 | Ryan .................. 329/302 |
| 4,873,457 A | 10/1989 | Sanielevici | |
| 4,878,474 A * | 11/1989 | Hack, Jr. .................. 123/516 |
| 5,040,242 A | 8/1991 | Tsuchiya et al. | |
| 5,430,766 A | 7/1995 | Ota et al. | |
| 5,570,052 A | 10/1996 | Fonderie et al. | |
| 5,764,598 A * | 6/1998 | Okayasu .................. 368/120 |
| 6,069,499 A | 5/2000 | Cho et al. | |
| 6,178,213 B1 * | 1/2001 | McCormack et al. ....... 375/355 |
| 6,256,557 B1 | 7/2001 | Avila et al. | |
| 6,509,990 B1 * | 1/2003 | Roberts .................. 398/212 |
| 6,735,162 B2 | 5/2004 | Armitage et al. | |
| 6,735,260 B1 | 5/2004 | Eliezer et al. | |
| 6,771,719 B1 * | 8/2004 | Koyama et al. .............. 375/345 |
| 7,058,150 B2 * | 6/2006 | Buchwald et al. ........... 375/355 |
| 2001/0021051 A1 * | 9/2001 | Kim .................. 359/161 |
| 2002/0027692 A1 * | 3/2002 | Uchiyama et al. ........... 359/158 |
| 2002/0057479 A1 * | 5/2002 | Takeshita et al. ............ 359/189 |

FOREIGN PATENT DOCUMENTS

| | | |
|---|---|---|
| DE | 38 31 296 A1 | 4/1989 |
| JP | 09246973 | 9/1997 |

* cited by examiner

*Primary Examiner*—Chieh M. Fan
*Assistant Examiner*—Siu M Lee
(74) *Attorney, Agent, or Firm*—Connolly Bove Lodge & Hutz LLP

(57) ABSTRACT

Systems and methods for aligning the phase of a PLL with an incoming data signal. In one embodiment, when a data signal is received in a PLL, a phase perturbation signal is generated and injected into the PLL. The PLL then performs a phase alignment procedure to lock on to the received data signal. The phase perturbation signal is a damped sinusoidal oscillation that is injected into the PLL when each of a plurality of data packets is received. The perturbation signal has an amplitude sufficient to bump the PLL out of a quasi-stable state around 180 degrees out of phase with the incoming data signal, but is damped to less than a degree of phase shift within 30 ns of being injected.

41 Claims, 8 Drawing Sheets

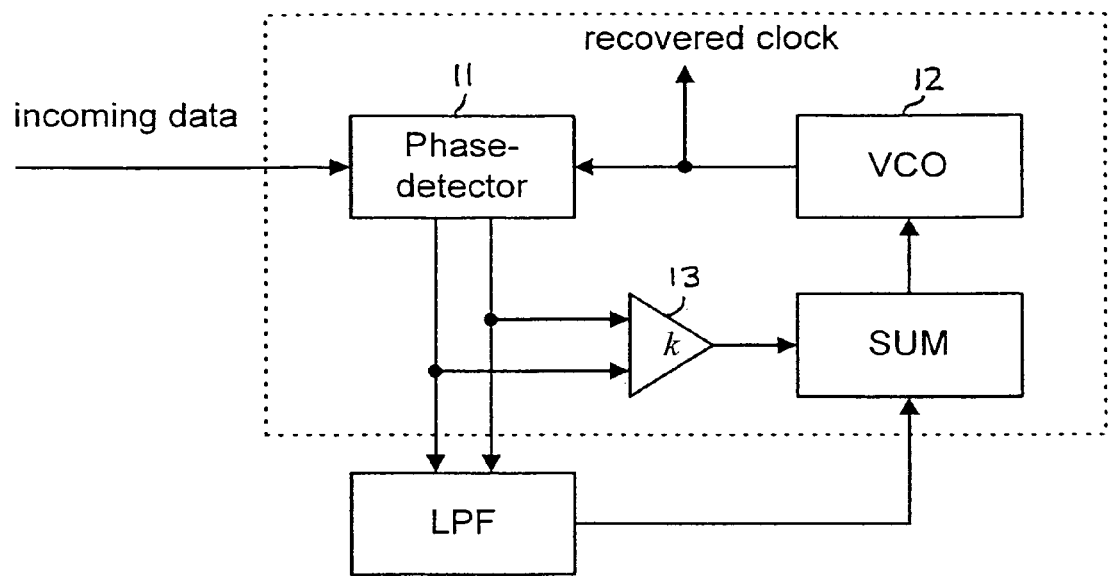
Fig.1-Prior Art
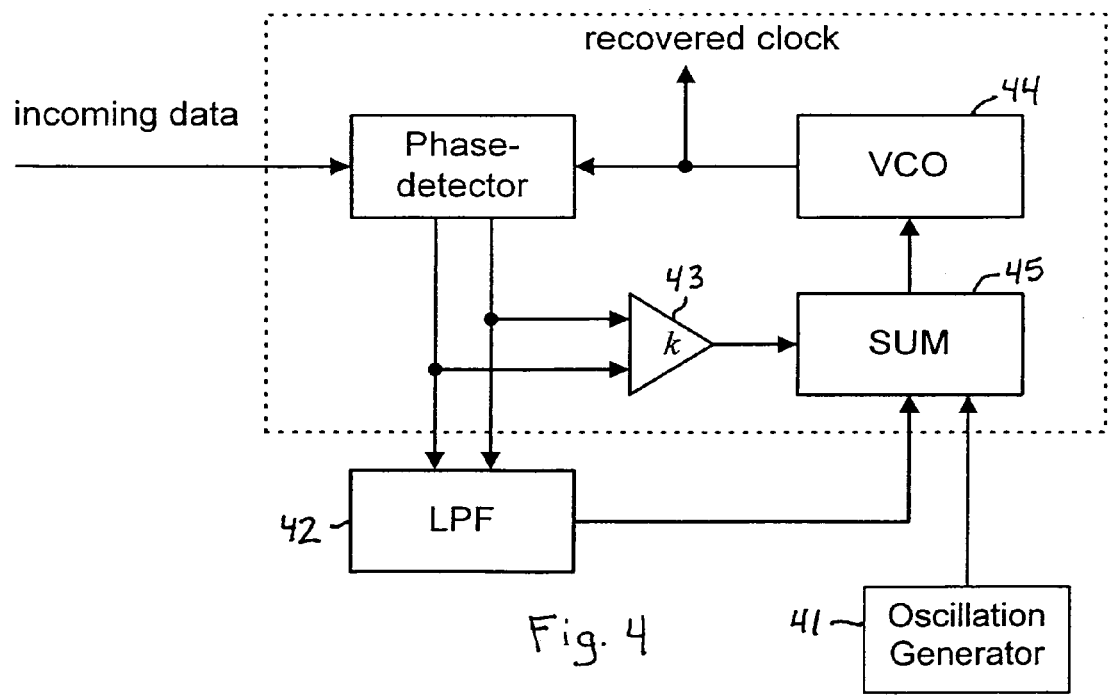
Fig. 4

FAST CLOCK ACQUISITION ENABLE METHOD USING PHASE STIR INJECTION TO PLL FOR BURST MODE OPTICAL RECEIVERS

RELATED APPLICATIONS

This application claims priority to U.S. Provisional Patent Application No. 60/375,663, entitled "Apparatus and Method for High Bit Rate Burst Mode Receiver", filed Apr. 26, 2002 by Bing Li, et al., which is incorporated by reference as if set forth herein in its entirety.

FIELD OF THE INVENTION

The invention relates generally to data communications and more particularly to systems and methods for increasing the speed with which a receiver can synchronize its internal clock with a clock signal embodied in a received data packet.

BACKGROUND OF THE INVENTION

In a TDM (time division multiplexed) data transmission system, it is not particularly important that the system be able to quickly recover a clock signal embodied in received data. In these systems, data is continuously received at what is essentially a constant level and with a constant phase. Consequently, once the appropriate level and phase are identified, they are not likely to change very often. When they do change, even if the level and phase are recovered (i.e. the receiver synchronizes itself with the data) very slowly (e.g., 100 microseconds), the time required to do so is still very small in comparison to the time which was spent transmitting data between resynchronization events (e.g., an hour or a day). Thus, the efficiency of the system will remain relatively high even if the system is very slow to synchronize itself.

In a packet switched system, on the other hand, it is very important to minimize the time required to synchronize the receiver with the data. This is because each successive packet of data which is received may originate from a different source node. Successive packets may therefore be out of phase of each other and may have different signal levels. In order to be able to correctly identify the data in a given packet, it is necessary for the receiver to synchronize itself with that packet. Because the receiver must be synchronized with each successive packet, the synchronization must take much less time than in a TDM system in order to maintain a high efficiency. For instance, if the time it takes to transmit the data in each packet is 1 microsecond, the receiver must be able to synchronize itself with each packet in 50 nanoseconds in order to maintain an efficiency of 95%. Moreover, if it takes too long to synchronize the receiver with the packet, the data in the packet may actually be lost.

Because packet switching systems are in such widespread use, many attempts have been made to identify faster means for rapidly recovering clock signals from data packets. Several approaches are conventionally used to provide the fastest means for locking in a phase locked loop (PLL). These approaches can be characterized as falling into either of two categories: zero acquisition time phase recovery PLL approaches; and traditional open loop PLL approaches.

Zero acquisition time phase recovery approaches are all based on a similar principle—discrete phase correlation. One problem with these approaches is that there are no existing devices using discrete phase correlation PLL architectures that operate at rates higher than 10 Gbps (gigabits per second). Another problem with these architectures is that they typically cannot distinguish between a 0 degree phase shift and a 180 degree phase shift. As a result, they may cause the system to stabilize out of phase or, in a more optimistic case, take a very long time to stabilize in phase. This problem can be illustrated by the example below.

Referring to FIG. 1, a block diagram illustrating a semi-classic PLL circuit is shown. This circuit uses a double-loop PLL architecture. An external second-order loop functions like an ordinary PLL circuit. An internal first-order loop functions as a phase alignment loop. The internal first-order loop functions essentially as described in the following paragraph.

Phase detector 11 provides a pulse indicating whether the phase of the voltage control oscillator (VCO) 12 precedes or follows the phase of the data transition on the incoming signal. Scalar amplifier 13 converts the pulse to a voltage level of constant magnitude $v_0$. The voltage will be either positive or negative, depending upon whether the VCO phase leads or lags the data transition. If the voltage is positive, the VCO phase will shift one direction, and if it is negative, the VCO phase will shift the other direction. The VCO clock is thereby phase shifted by a fixed amount per clock cycle (or bit). This shifting of the VCO clock will continue until its phase is aligned with the incoming signal to a resolution equal to the magnitude of the phase shift per clock cycle. (It should be noted that this procedure may "overshoot" exact alignment of the clock signals, but will do so by no more than the amount of the phase shift per clock cycle.)

The problem with this system is, as noted above, that signals which are 180 degrees out of phase may look the same to the system as signals which are in phase. For example, an Alexander phase detector samples the incoming data signal at both rising and falling edges of the VCO clock signal. As shown in FIG. 2, shifting the VCO clock signal will cause the data signal to be sampled at exactly the same points. Thus, 180 degrees looks just like 0 degrees and the system may therefore remain at 180 degrees because the two signals appear to already be aligned.

While this may not always cause these systems to remain out of phase, it will typically cause the systems to take a substantially greater amount of time to align the phases of the signals. For example, it has been found that a MTC1234 CDR chip has a window of approximately 30 degrees (around 180 degrees) from which it is substantially slower to align the phases of the signals. It has been empirically determined that, within this window, this chip needs at least 200 ns to align the signals, while only 20 ns are needed outside this window.

SUMMARY OF THE INVENTION

One or more of the problems outlined above may be solved by the various embodiments of the invention. Broadly speaking, the invention comprises improved systems and methods for increasing the speed with which the phase of a PLL's internal clock is aligned with an incoming data signal. One embodiment is a method comprising receiving a data signal in a PLL, generating a phase perturbation (phase stir) signal, injecting the phase perturbation signal into the PLL and allowing the PLL to lock on to the received data signal. The phase perturbation signal may be a damped sinusoidal oscillation that is injected into the PLL when each of a plurality of data packets is received. The perturbation signal has an amplitude sufficient to bump the PLL out of the quasi-stable state around 180 degrees out of phase with the incoming data signal.

In another embodiment, a device comprises a PLL and a perturbation signal generator coupled to the PLL and configured to inject the perturbation signal into the PLL, wherein the perturbation signal generator is configured to inject the perturbation signal into the PLL when a new data packet is received. The PLL may have semi-classic double-loop architecture, wherein an external second-order loop locks in to the frequency of the incoming data signal, and an internal first-order loop synchronizes the phase of the internal clock to that of the incoming signal. The perturbation signal generator in this embodiment generates a damped sinusoidal oscillation that is injected into the voltage controlled oscillator of the PLL. In an embodiment configured to be used in an optical data packet receiver, the injected oscillating signal is damped so that its amplitude is nearly zero within 20-30 ns. The device can then stabilize and reach phase alignment within about 30 ns.

Numerous additional embodiments are also possible.

The various embodiments of the invention may provide a number of advantages over the prior art. For example, a system in accordance with one embodiment of the invention achieves phase alignment in less than 30 ns in the worst case. Comparable PLLs which do not have perturbation signals injected into them may have worst case performance of 200 ns. Another significant advantage that may be provided is that the time required to synchronize the internal clock with the received data is always shortened (as compared with an equivalent PLL without the injection of the perturbation signal), while other signal injection approaches may actually push the system into the "trap" at 180 degrees, thereby lengthening the synchronization time. Additional advantages may also be provided.

BRIEF DESCRIPTION OF THE DRAWINGS

Other objects and advantages of the invention may become apparent upon reading the following detailed description and upon reference to the accompanying drawings.

FIG. 1 is a block diagram illustrating a semi-classic PLL circuit as used in the prior art.

FIG. 4 a block diagram illustrating a clock recovery circuit according to one embodiment.

Figure 2:
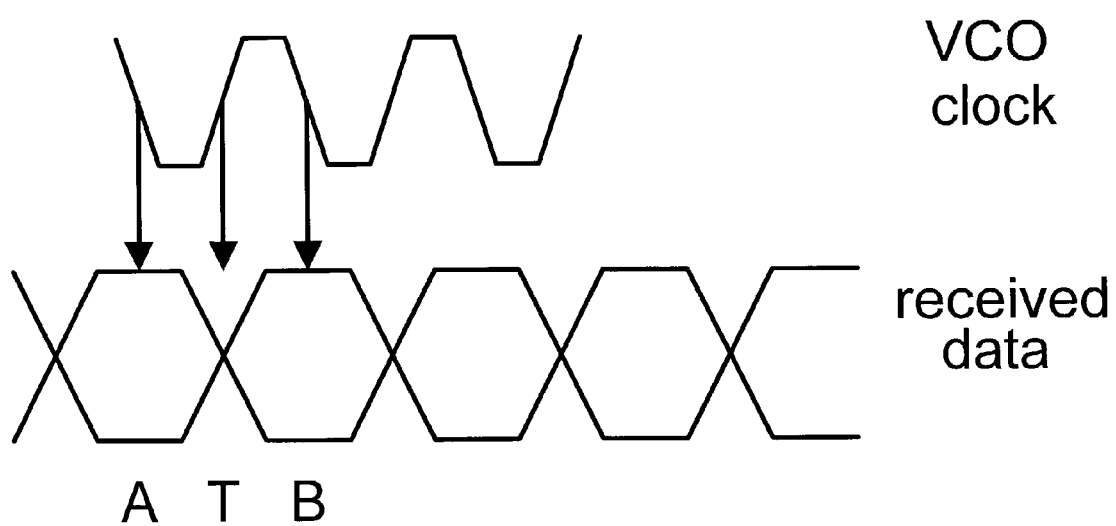
FIG. 2 is a diagram illustrating the sampling of a data signal in a manner which causes a phase signature characteristic of a 0 degree phase shift to match the phase signature characteristic of a 180 degree phase shift.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION

A preferred embodiment of the invention is described below. It should be noted that this and any other embodiments described below are exemplary and are intended to be illustrative of the invention rather than limiting.

Broadly speaking, the invention comprises improved systems and methods for fast acquisition of a clock signal. In one embodiment, the present system is based upon a double-loop PLL architecture. Since this type of architecture normally has poor acquisition speed when the clock signal to be recovered is around 180 degrees out of phase with the VCO signal, an oscillating signal is injected into the VCO signal. The purpose of injecting this signal is to bump the system out of the quasi-stable state around 180 degrees and to allow the system to stabilize in phase (0 or 360 degrees out of phase). The oscillating signal is damped so that it will not hinder stabilization of the system with the signals in phase.

It should be noted that, for the purposes of this disclosure, references to degrees (e.g., "180 degrees") are to be construed as the phase relation between the VCO clock signal and the clock signal embodied in the received data stream (the recovered clock signal) unless indicated otherwise by the context of the description (e.g., "180+/−15 degrees").

One embodiment, as noted above, is based upon a semi-classic double-loop PLL architecture. It has been determined that this architecture, when used in prior art systems, is able to recover the clock signal within about 20 ns if the signals are initially less than 165 degrees out of phase (in either direction). If, however, the signals are initially 165 to 180 degrees out of phase, the prior art systems may require a much longer time (up to 200 ns) to recover the clock signal. If the system has to recover the clock signal for individual packets (which may, for example, take only one millisecond to transmit), this performance is unacceptable. The purpose of the present systems and methods is to "bump" the signals out of the quasi-stable state at 180+/−15 degrees so that the clock signal can be more rapidly recovered.

Bumping the system out of the quasi-stable state at 180 degrees is accomplished in the present systems and methods by injecting an oscillating signal into the VCO. As a result of this oscillation, the phase relation between the VCO clock and the received clock is not allowed to remain steady at its initial phase shift. Instead, the injected oscillating signal causes the phase shift to oscillate. While the PLL architecture may be very slow to correct the phase shift when it is around 180 degrees, the shift will oscillate between 180+n degrees to 180−n degrees, where n is the amplitude of the oscillation in degrees. (It should be noted that n, as used here, is a variable that decreases with time as a result of the damping of the oscillations.) When the phase is shift is 180+n (or −n) degrees, the PLL architecture operates to more rapidly correct the phase shift than when the system is at 180 degrees. Thus, the system is quickly pulled out of the quasi-stable state at 180 degrees.

Figure 3:
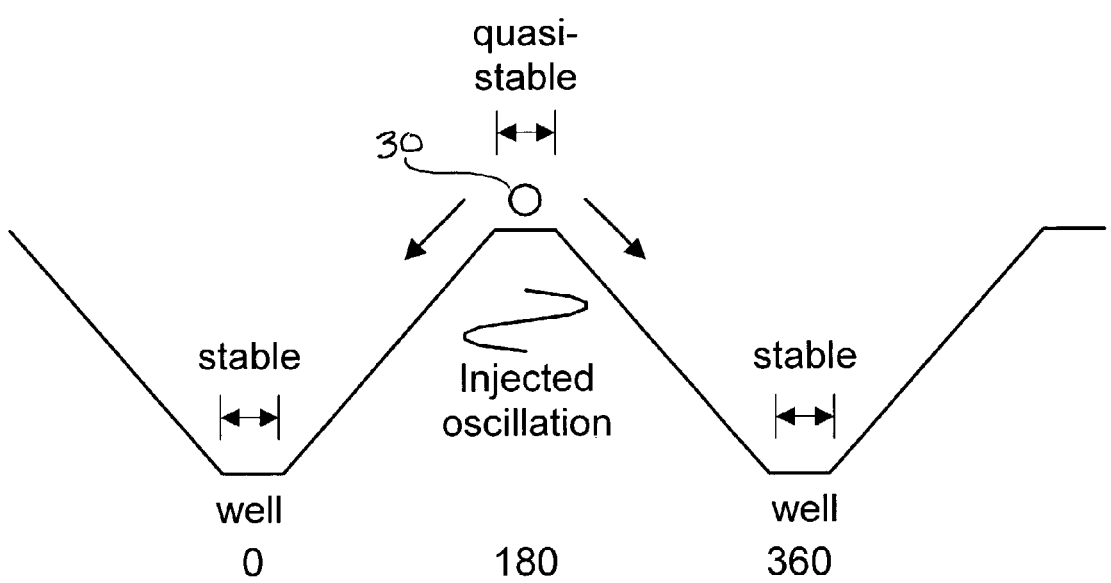
FIG. 3 is a diagram illustrating the similarity between a quasi-stable phase shift and a high-potential plateau between a pair of potential wells.

It may be helpful to view this situation as being similar to an electron on a plateau between potential wells, or even as a ball on top of a hill. Referring to FIG. 3, an electron (or ball) 30 is shown on a plateau. The plateau is at 180 degrees. While the plateau may not be completely flat, its slope is minimal, so it will take longer for the electron to fall into either the well at 0 degrees or the well at 360 degrees than if it were initially at some intermediate point. If the electron is "pushed" one way or the other, it will be on a steeper slope and will fall more quickly into the corresponding well. Even if the electron is pushed back the other way, this "uphill" force will have less effect than the "downhill" force, since the downhill force acts with the slope of the well instead of against it.

Referring to FIG. 4, a block diagram illustrating a clock recovery circuit according to one embodiment of the present invention is shown. This circuit is similar to that of FIG. 1, but an oscillation voltage is generated by oscillator 41, and this voltage is summed (by summing circuit 45) with the voltages of LPF 42 and scalar amplifier 43. The resulting voltage has an oscillating component that causes VCO 44 to move rapidly into phase with the received data signal.

Figure 5:
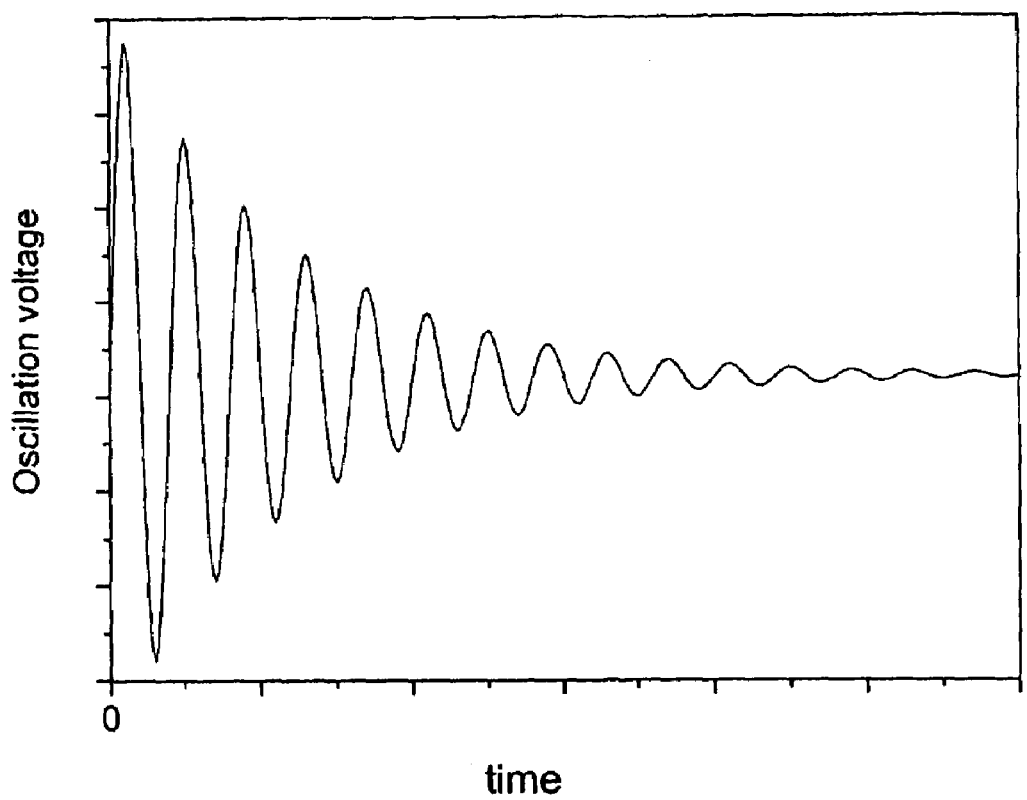
FIG. 5 is a diagram illustrating the general form of a damped oscillating waveform.

While the oscillating voltage component is initially introduced to bump the system out of the quasi-stable state, there is no need for this component after the system has left this state. In fact, the oscillation may prevent the system from stabilizing with the VCO and receiving clock signals in phase. The oscillating signal is therefore damped so that it will initially be sufficient to move the system out of the quasi-stable state, and then will die out, leaving the system unaffected. An exemplary damped oscillating signal is illustrated in FIG. 5.

Figure 6:
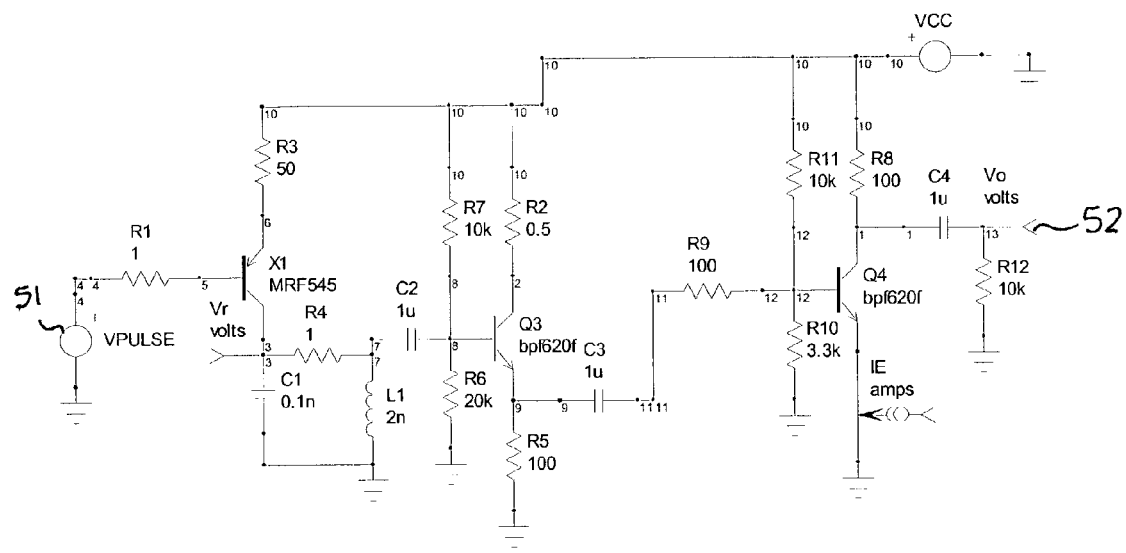
FIG. 6 is a schematic diagram of a circuit as used in one embodiment to generate a damped oscillating waveform.
Figure 7:
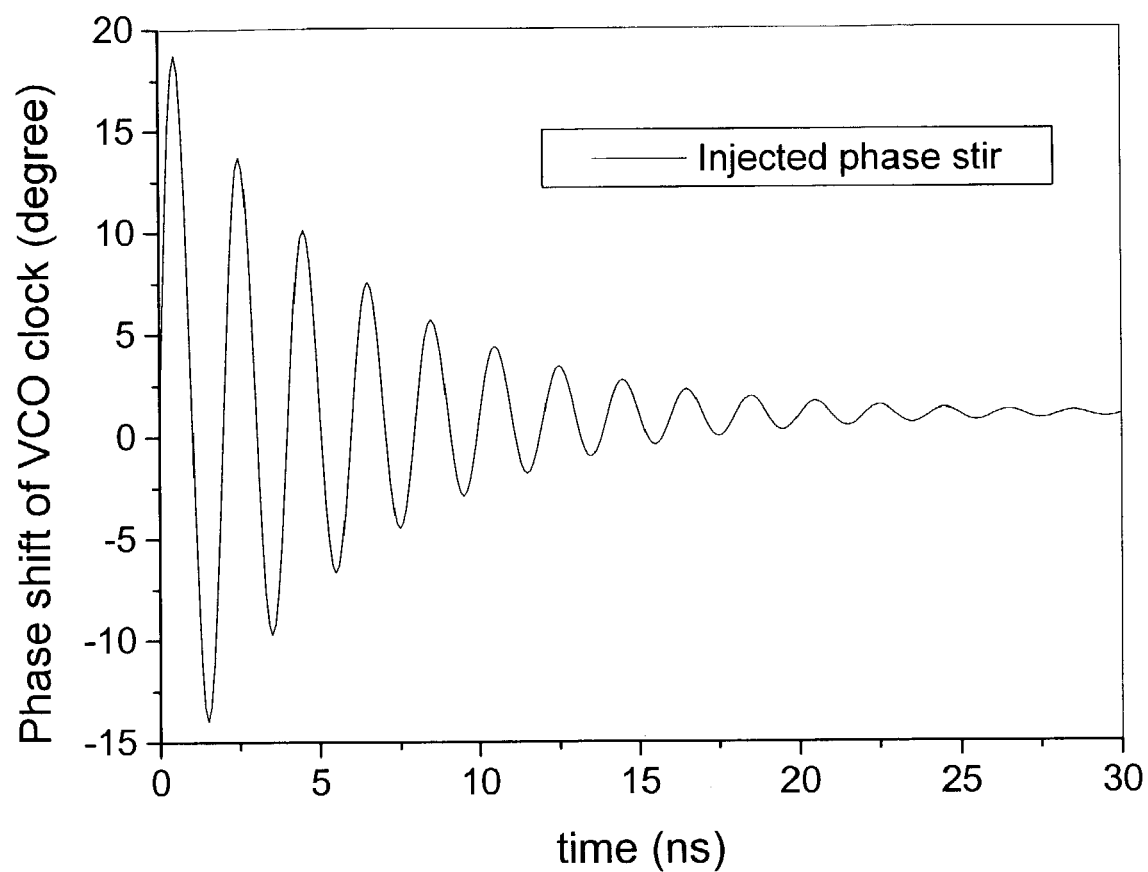
FIG. 7 is a diagram illustrating the phase shift that is caused by a damped oscillating waveform as employed in one embodiment.

Referring to FIG. 6, a schematic diagram of an oscillator circuit as used in one embodiment is shown. When a pulse is generated by pulse generator 51, the voltage at output 52 begins to oscillate. The oscillation is damped so that it is increasingly attenuated. Output 52 is coupled to feed the oscillating signal into the VCO. The oscillating signal generated by the circuit of FIG. 6 causes the VCO to generate a phase shift as shown in FIG. 7. It can be seen that the phase shift is about 19 degrees on the first oscillation, about 14 degrees on the second and third, 10 degrees on the fourth and fifth, and so on. By 20 ns after the initial oscillation, the amplitude of the oscillations is about one degree and, after 30 ns, the oscillations are almost completely attenuated.

Figure 8A:
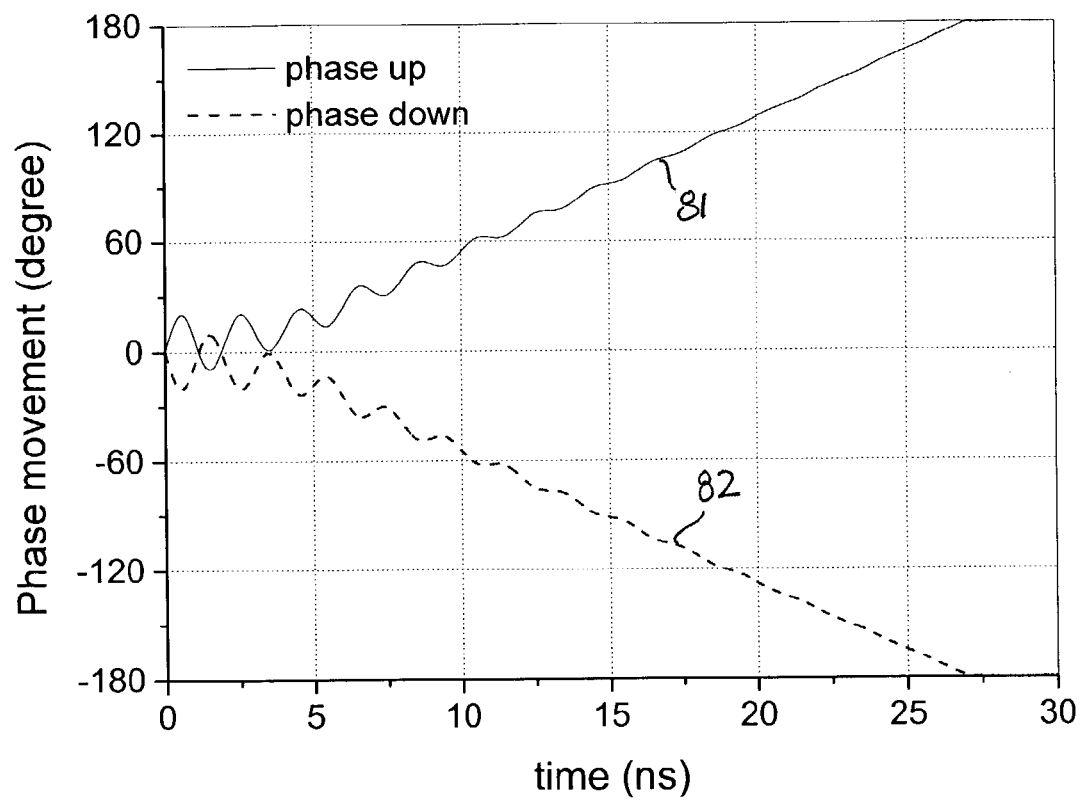
FIGS. 8A and 8B are diagrams illustrating the amount of time required by a PLL in one embodiment to lock onto a received clock signal when the signals are initially 180 degrees out of phase.
Figure 8B:
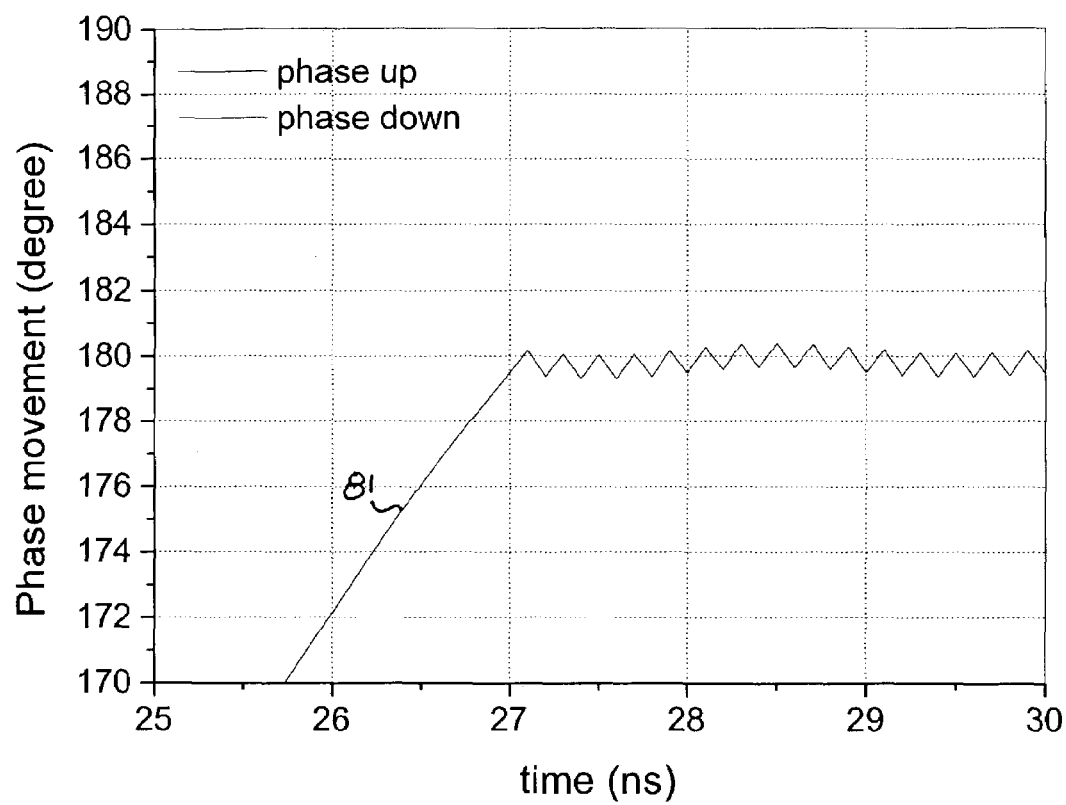

The phase oscillation shown in FIG. 7 is generated when the circuit of FIG. 6 is coupled to an MTC1234 10 Gbps CDR/DeMUX chip as shown generally by FIG. 4. The clock recovery performance of this system is shown in FIGS. 8A and 8B. These figures show the amount of time required by the PLL to lock onto the received clock signal when the signals are initially 180 degrees out of phase.

Referring to FIG. 8A, two performance curves are depicted. Curve 81 corresponds to the phase alignment of the clock signals when the initial oscillation is positive, while curve 82 corresponds to the alignment of the clock signals when the initial oscillation is negative. The time corresponds to the time at which the oscillation is initiated. It can be seen from the figure that the initial oscillation determines the direction of the shifting which will bring the clock signals into alignment. In other words, if the first oscillation is positive, the phase shift will increase until the signals are aligned, but if the first oscillation is negative, the phase shift will decrease until the signals are aligned. It can also be seen from the figure that, by the time the signals approach phase alignment, the oscillations have been attenuated to the point that they are not noticeable.

Referring to FIG. 8B, an expanded portion of curve 81 is shown. This figure depicts the phase alignment of the clock signals between 25 and 30 ns, and between 170 and about 180 degrees. No oscillation can be seen in the phase shift until alignment is achieved. After the signals become aligned (at about 27 ns), the phase shift can be seen to bounce back and forth between about 179.5 and 180.5 degrees. This is because the resolution of the system (the size of the phase adjustment steps) is one degree. Once the alignment passes 180 degrees (i.e. to 180.5 degrees), the alignment is pulled back to 179.5 degrees, then to 180.5 degrees, and so on.

As noted above, without the injection of the oscillating signal, the same PLL required 200 ns to reach alignment when starting at 180 degrees out of phase. It can be seen from FIGS. 8A and 8B that only about 27 ns (30 ns worst case) is required when the oscillating signal is injected into the system.

The embodiments of the invention described above are directed to clock recovery PLLs. The reduction of the time required to recover a clock signal from a received data stream enables the packet switching of optical data. This type of switching was not previously possible because there was no way to guarantee that the recovery of the clock signal for each packet could be done in a timely manner. If the clock signal was not recovered in time, the corresponding data was lost. As noted above, the PLL in the MTC1234 CDR chip has a worst case recovery time of 200 ns without the injected oscillating signal. Since this maximum clock recovery time is reduced to under 30 ns in the worst case by the present systems and methods, higher data transfer rates are now possible.

It should be noted that the present systems and methods are useful in a wider range of applications than specifically described above (i.e., other than optical data switching applications). The same type of oscillating signal can be used in any PLL with multiple stable states to reduce the time required for the PLL to stabilize or lock on to the received signal.

Similarly, it is not necessary for the PLL to employ a damped oscillating signal. Other types of signals may also be used. In one alternative embodiment, an undamped oscillating signal could be injected into the PLL for a finite period of time (e.g., 10 ns). This would provide a means to bump the system out of a quasi-stable state, but would not interfere with the stabilization of the system in the desired state (the signal would be removed from the system prior to the maximum allowable time it to stabilize). In another alternative embodiment, the damped oscillating signal could be replaced by a signal that went from an initial level (e.g., voltage) to a different level, then back to the original level. Still other variations on the type of signal are also possible. These signals may be collectively referred to as perturbation signals.

It is also not necessary to inject the perturbation signal at regular intervals (e.g., when each new data packet is received). It may be possible to identify instances in which the phase shift is within the window (e.g., 180+/−15 degrees) in which the perturbation signal is most effective. If the phase shift is outside this window, the system may lock on to the received signal more quickly in the absence of the perturbation signal. This increase in speed may, however, be minimal, so it may be simpler to inject the perturbation signal each time a new signal is to be acquired.

The benefits and advantages which may be provided by the present invention have been described above with regard to specific embodiments. These benefits and advantages, and any elements or limitations that may cause them to occur or to become more pronounced are not to be construed as a critical, required, or essential features of any or all of the claims. As used herein, the terms "comprises," "comprising," or any other variations thereof, are intended to be interpreted as non-exclusively including the elements or limitations which follow those terms. Accordingly, a process, method, article, or apparatus that comprises a list of elements does not include only those elements but may include other elements not expressly listed or inherent to the claimed process, method, article, or apparatus.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention as detailed within the following claims.

What is claimed is:

1. A method comprising:
   receiving a data signal in a PLL;
   generating a phase perturbation signal, wherein the phase perturbation signal comprises an oscillating signal;
   injecting the phase perturbation signal into the PLL for a predetermined period which is less than a maximum time allowed for the PLL to lock on to the received data signal; and
   allowing the PLL to lock on to the received data signal.

2. The method of claim 1, wherein an amplitude of the oscillating signal is greater than 30 degrees, peak-to-peak, with reference to a phase relation between the PLL and the received data signal.

3. The method of claim 1, wherein the PLL comprises a double-loop PLL having a first loop configured to adjust the frequency of an internal reference signal to match the frequency of the received signal and a second loop configured to adjust the phase of the internal reference signal to match the phase of the received signal, and wherein the perturbation signal is injected into the second loop.

4. The method of claim 1, wherein performing phase alignment comprises adjusting the phase of an internal reference signal to match the phase of the received data signal.

5. The method of claim 4, wherein a phase signature corresponding to a 0-degree phase shift is substantially identical to a phase signature corresponding to a 180-degree phase shift.

6. A device comprising:
   a PLL; and
   a perturbation signal generator coupled to the PLL and configured to generate an oscillating perturbation signal and inject the oscillating perturbation signal into the PLL;
   wherein the oscillating perturbation signal is undamped; and
   wherein the perturbation signal generator is configured to inject the oscillating perturbation signal into the PLL when a new data signal is received for a predetermined period which is less than a maximum time allowed for the PLL to lock on to the received data signal.

7. The device of claim 6, wherein the PLL is coupled to a high-speed optical data switch and wherein the PLL is configured to recover a clock signal corresponding to each received data packet.

8. A device comprising:
   a PLL; and
   a perturbation signal generator coupled to the PLL and configured to generate an oscillating perturbation signal and inject the oscillating perturbation signal into the PLL;
   wherein the oscillating perturbation signal is damped;
   wherein the perturbation signal generator is configured to inject the oscillating perturbation signal into the PLL when a new data signal is received; and
   wherein the perturbation signal generator is configured to generate the oscillating perturbation signal independently of the data signal.

9. The device of claim 6, wherein the PLL is configured to perform phase alignment.

10. The device of claim 9, wherein a phase signature corresponding to a 0-degree phase shift is substantially identical to a phase signature corresponding to a 180-degree phase shift.

11. The device of claim 6, wherein the PLL comprises a double-loop PILL having a first loop configured to adjust the frequency of an internal reference signal to match the frequency of the received signal and a second loop configured to adjust the phase of the internal reference signal to match the phase of the received signal, and wherein the perturbation signal is injected into the second loop.

12. A system comprising:
   a receiver configured to be coupled to an optical fiber and to receive optical data signals via the optical fiber;
   a PLL coupled to the receiver, wherein the PLL is configured to receive the optical data signals and to synchronize an internal clock signal with the optical data signals; and
   a perturbation signal generator coupled to the PLL and configured to inject a perturbation signal into the PLL, wherein the perturbation signal comprises an oscillating signal;
   wherein the system is configured, upon receipt of an optical signal, to generate a perturbation signal and inject the perturbation signal into the internal clock of the PLL for a predetermined period which is less than a maximum time allowed for the PLL to lock on to the received data signal and wherein the PLL is configured to perform a phase alignment procedure to align the internal clock signal with the received optical signal.

13. The system of claim 12, wherein the perturbation signal generator is coupled to a voltage controlled oscillator of the PLL and configured to inject the perturbation signal into the voltage controlled oscillator.

14. A method comprising:
   receiving a data signal in a PLL;
   generating a phase perturbation signal, wherein the phase perturbation signal comprises an oscillating signal;
   injecting the phase perturbation signal into the PLL;
   damping the oscillating signal to cause no more than one degree of phase at 30 ns from injection of the oscillating signal into the PLL; and
   allowing the PLL to lock on to the received data signal.

15. The method of claim 14, wherein the initial amplitude of the oscillating signal is greater than 30 degrees, peak-to-peak, with reference to a phase relation between the PLL and the received data signal.

16. The method of claim 14, wherein the PLL comprises a double-loop PLL having a first loop configured to adjust the frequency of an internal reference signal to match the frequency of the received signal and a second loop configured to adjust the phase of the internal reference signal to match the phase of the received signal, and wherein the perturbation signal is injected into the second loop.

17. The method of claim 14, wherein performing phase alignment comprises adjusting the phase of an internal reference signal to match the phase of the received data signal.

18. The method of claim 17, wherein a phase signature corresponding to a 0-degree phase shift is substantially identical to a phase signature corresponding to a 180-degree phase shift.

19. A method comprising:
   receiving a data signal in a PLL;
   generating a phase perturbation signal independently of the data signal;
   injecting the phase perturbation signal into the PLL wherein the PLL comprises a double-loop PLL having a first loop configured to adjust the frequency of an internal reference signal to match the frequency of the received signal and a second loop configured to adjust the phase of the internal reference signal to match the phase of the received signal, and wherein the perturbation signal is injected into the second loop; and allowing the PLL to lock on to the received data signal.

20. The method of claim 19, wherein the phase perturbation signal comprises an oscillating signal.

21. The method of claim 20, further comprising damping the oscillating signal.

22. The method of claim 21, further comprising damping the oscillating signal to cause no more than one degree of phase 20 ns from injection of the oscillating signal into the PLL.

23. The method of claim 20, injecting the oscillating signal into the PLL for a predetermined period which is less than a maximum time allowed for the PLL to lock on to the received data signal.

24. The method of claim 20, wherein the initial amplitude of the oscillating signal is greater than 30 degrees, peak-to-peak.

25. The method of claim 19, wherein performing phase alignment comprises adjusting the phase of an internal reference signal to match the phase of the received data signal.

26. The method of claim 25, wherein a phase signature corresponding to a 0-degree phase shift is substantially identical to a phase signature corresponding to a 180-degree phase shift.

27. A device comprising:
a PLL; and
a perturbation signal generator coupled to the PLL and configured to generate an oscillating perturbation signal and inject the oscillating perturbation signal into the PLL;
wherein the perturbation signal generator is configured to inject the oscillating perturbation signal into the PLL when a new data signal is received; and
wherein the oscillating perturbation signal is damped to cause less than one degree of phase shift by 30 ns after the signal is injected.

28. The device of claim 27, wherein the PLL is coupled to a high-speed optical data switch and wherein the PLL is configured to recover to clock signal corresponding to each received data packet.

29. The device of claim 27, wherein the PLL is configured to perform phase alignment.

30. The device of claim 29, wherein a phase signature corresponding to a 0-degree phase shift is substantially identical to a phase signature corresponding to a 180-degree phase shift.

31. The device of claim 27, wherein the PLL comprises a double-loop PLL having a first loop configured to adjust the frequency of an internal reference signal to match the frequency of the received signal and a second loop configured to adjust the phase of the internal reference signal to match the phase of the received signal, and wherein the perturbation signal is injected into the second loop.

32. A device comprising:
a PLL, wherein the PLL comprises a double-loop PLL having a first loop configured to adjust the frequency of an internal signal to match the frequency of a received signal and a second loop configured to adjust the phase of the internal reference signal to match the phase of the received signal, and wherein a perturbation signal is injected into the second loop; and a perturbation signal generator coupled to the PLL and configured to inject the perturbation signal into the PLL;
wherein the perturbation signal generator is configured to inject the perturbation signal into the PLL when a new data signal is received and to generate the perturbation signal independently of the data signal.

33. The device of claim 32, wherein the PLL is coupled to a high-speed optical data switch and wherein the PLL is configured to recover a clock signal corresponding to each received data packet.

34. The device of claim 32, wherein the perturbation signal generator is configured to generate an oscillating perturbation signal.

35. The device of claim 34, wherein the oscillating perturbation signal is damped.

36. The device of claim 35, wherein the oscillating perturbation signal is damped to cause less than one degree of phase shift by 30 ns after the signal is injected.

37. The device of claim 34, wherein the oscillating perturbation signal is undamped and wherein the oscillating perturbation signal is injected into the PLL for a predetermined period which is less than a maximum time allowed for the PLL to lock on to the received data signal.

38. The device of claim 34, wherein the PLL is configured to perform phase alignment.

39. The device of claim 38, wherein a phase signature corresponding to a 0-degree phase shift is substantially identical to phase signature corresponding to a 180-degree phase shift.

40. A method comprising:
receiving a data signal in a PLL;
generating an oscillating phase perturbation signal;
damping the oscillating phase perturbation signal;
injecting the phase perturbation signal into the PLL wherein the PLL comprises a double-loop PLL having a first loop configured to adjust the frequency of an internal reference signal to match the frequency of the received signal and a second loop configured to adjust the phase of the internal reference signal to match the phase of the received signal, and wherein the perturbation signal is injected into the second loop; and
allowing the PLL to lock on to the received data signal,
wherein said damping comprises damping the oscillating phase perturbation signal to cause no more than one degree of phase 20 ns from injection of the oscillating signal into the PLL.

41. A device comprising:
a PLL, wherein the PLL comprises a double-loop PLL having a first loop configured to adjust the frequency of an internal signal to match the frequency of a received signal and a second loop configured to adjust the phase of the internal reference signal to match the phase of the received signal, and wherein an oscillating perturbation signal is injected into the second loop; and
a perturbation signal generator coupled to the PLL and configured to inject the oscillating perturbation signal into the PLL;
wherein the perturbation signal generator is configured to inject the perturbation signal into the PLL when a new data signal is received, and
wherein the oscillating perturbation signal is damped to cause less than one degree of phase shift by 30 ns after the signal is injected.

* * * * *

UNITED STATES PATENT AND TRADEMARK OFFICE
CERTIFICATE OF CORRECTION

PATENT NO. : 7,421,053 B1  Page 1 of 1
APPLICATION NO. : 10/423819
DATED : September 2, 2008
INVENTOR(S) : Bing Li et al.

It is certified that error appears in the above-identified patent and that said Letters Patent is hereby corrected as shown below:

In Claim 11, column 8, line 6, please change "double-loop PILL having a first loop configured to adjust the" to read --double-loop PLL having a first loop configured to adjust the--.

Signed and Sealed this

Twenty-first Day of October, 2008

JON W. DUDAS
*Director of the United States Patent and Trademark Office*